(12) United States Patent
Zubairy et al.

(10) Patent No.: US 8,350,587 B2
(45) Date of Patent: Jan. 8, 2013

(54) REVERSING THE WEAK MEASUREMENT ON A QUBIT

(75) Inventors: Mohammad Suhail Zubairy, College Station, TX (US); Marlan Scully, Bryan, TX (US); Mohammad Al-Amri, Riyadh (SA)

(73) Assignee: Texas A&M University System, College Station, TX (US)

( * ) Notice: Subject to any disclaimer, the term of this patent is extended or adjusted under 35 U.S.C. 154(b) by 0 days.

(21) Appl. No.: 13/278,768

(22) Filed: Oct. 21, 2011

(65) Prior Publication Data

US 2012/0098564 A1 Apr. 26, 2012

Related U.S. Application Data

(60) Provisional application No. 61/405,959, filed on Oct. 22, 2010.

(51) Int. Cl.
*H03K 19/195* (2006.01)
(52) U.S. Cl. .................................. 326/3; 326/7
(58) Field of Classification Search .............. 326/1–7
See application file for complete search history.

(56) References Cited

U.S. PATENT DOCUMENTS

| | | | |
|---|---|---|---|
| 7,893,708 B2 * | 2/2011 | Baumgardner et al. | 326/7 |
| 7,996,452 B1 * | 8/2011 | Cruz-Albrecht et al. | 708/400 |
| 8,111,083 B1 * | 2/2012 | Pesetski et al. | 326/3 |

OTHER PUBLICATIONS

G. Rempe and H. Walther, "Observation of Quantum Collapse and Revival in a One-Atom Maser," Physical Review Letters, vol. 58, No. 4, pp. 353-356, Jan. 26, 1987.

G. Rempe, F. Schmidt-Kaler, and H. Walther, "Observation of Sub-Piossonian Photon Statistics in a Micromaser," Physical Review Letters, vol. 64, No. 23, pp. 2783-2786, Jun. 4, 1990.

M. Brune, F. Schmidt-Kaler, A. Maali, J. Dreyer, E. Hagley, J.M. Raimond, and S. Haroche, "Quantum Rabi Oscillation: A Direct Test of Field Quantization in a Cavity," Physical Review Letters, vol. 76, No. 11, pp. 1800-1803, Mar. 11, 1996.

Q. Sun, M. Al-Amri, and M. Suhail Zubairy, "Reversing the Weak Measurement of an Arbitrary Field with Finite Photon Number," Physical Review A, vol. 80, No. 3, pp. 033838-1-033838-5, Sep. 25, 2009.

A. Rauschenbeutel, G. Nogues, S. Osnaghi, P. Bertet, M. Brune, J.M. Raimond, and S. Haroche, "Coherent Operation of a Tunable Quantum Phase Gate in Cavity QED," Physical Review Letters, vol. 83, No. 24, pp. 5166-5169, Dec. 13, 1999.

M. Al-Amri, M. O. Scully, and M. S. Zubairy, "Reversing Weak Measurement on a Qubit," Journal of Physics B: Atomic, Molecular and Optical Physics, vol. 4, No. 16, pp. 165509-1-165509-5, Jul. 29, 2011.

M. S. Zubairy, "Erasing Memory and Quantum Reversibility," presented at the Workshop on Quantum Nonstationary Systems, Brasilia, Brazil on Oct. 20, 2009.

Statement by Inventor Dr. M. S. Zubairy regarding Non-Patent Literature Document No. 7.

* cited by examiner

*Primary Examiner* — James H Cho
(74) *Attorney, Agent, or Firm* — Wong, Cabello, Lutsch, Rutherford & Brucculeri, LLP

(57) ABSTRACT

Methods and systems are disclosed for restoring a state of a qubit transformed by a weak measurement to its original state. Unlike traditional methods, in which, the restoration was carried out by way of another weak measurement, the disclosed method uses an additional qubit, referred to as the ancillary qubit, and appropriate Hadamard and CNOT transformation for restoring the original state. Because the disclosed method avoids a second weak measurement, the time for restoration of the original state is considerably reduced.

7 Claims, 2 Drawing Sheets

US 8,350,587 B2

REVERSING THE WEAK MEASUREMENT ON A QUBIT

CROSS REFERENCE TO RELATED APPLICATIONS

This application claims the benefit of U.S. Provisional Application No. 61/405,959 (the "959 application"), entitled "Reversing the Weak Measurement on a Qubit," filed Oct. 22, 2010. This provisional application is incorporated herein by reference in its entirety.

FIELD OF THE INVENTION

The present invention generally relates to quantum computing and in particular relates to reversing state of a qubit after a weak measurement.

BACKGROUND

The basic unit of information processing in modern day computers is a bit, which can exist in one of two states: 0 or 1. In quantum computing the basic unit of information processing is a qubit. Like a bit, the qubit can also exist in two states, which states are denoted as state $|0\rangle$ and state $|1\rangle$. But unlike a bit, a qubit can also exist in superposition states, which are a linear combination of state $|0\rangle$ and state $|1\rangle$. For example, if the qubit were to be denoted by $|\psi\rangle$, then the superposition states of the qubit can be described by the expression: $|\psi\rangle = \alpha|0\rangle + \beta|1\rangle$, where $\alpha$ and $\beta$ are complex amplitudes (also known as probability amplitudes). Therefore, the qubit $|\psi\rangle$ can exist in any of the states described by the continuous variables $\alpha$ and $\beta$. This property of qubits is essential in quantum computing. Therefore, if the qubit $|\psi\rangle$ is prepared in a superposition state for quantum computing, then it is essential that the superposition state of the qubit $|\psi\rangle$ be maintained throughout the computing process.

Results of a quantum computation require that one or more qubits of the quantum computer be measured. Two kinds of measurements can be carried out on the qubit $|\psi\rangle$: a strong measurement and a weak measurement. In a strong measurement, the qubit ceases to exist in the superposition state, and collapses into one of its so-called eigenstates. For the qubit $|\psi\rangle$, these eigenstates are the states $|0\rangle$ and $|1\rangle$. Therefore, after a strong measurement, the qubit $|\psi\rangle$ will collapse in a state $|0\rangle$ or state $|1\rangle$. An example of a strong measurement is a detector detecting a click in a cavity quantum electrodynamics (QED) system implementing the qubit $|\psi\rangle$, where measuring a click indicates that the qubit $|\psi\rangle$ has collapsed into state $|1\rangle$. Because of the collapse of the superposition state, information related to the original state of the system cannot be recovered. In other words, the values of $\alpha$ and $\beta$ (also known as the eigenvalues) are lost.

In a weak measurement, the full collapse into the eigenstate does not take place, and it is possible, to reverse the measurement so that the original state of the system is restored. This reversal is possible, because for weak measurement, the full information of the probability amplitudes involved in the superposition of the states is retained. One example of a weak measurement is the leakage of the field inside a cavity QED system. If a measurement is made on the qubit $|\psi\rangle$ using a detector, and the detector registers a click, then this means that qubit $|\psi\rangle$ has collapsed to the state $|1\rangle$. Thus, the information on amplitudes $\alpha$ and $\beta$ is lost and no longer recoverable. This, of course, indicates a strong measurement. If however, the detector does not register a click for time $\tau$, then the state evolves into $|\psi(\tau)\rangle = (\alpha|0\rangle + e^{-\gamma\tau}\beta|1\rangle)/\sqrt{|\alpha|^2 + |\beta|^2 e^{-2\gamma\tau}}$ where $\gamma$ is the cavity decay rate. This is an example of a weak measurement where we gain partial information on the state of the qubit $|\psi\rangle$, but information of the amplitudes $\alpha$ and $\beta$ is fully retained. Note that the above equation can also describe a weak measurement on a qubit implemented in systems other than the cavity QED system with $\gamma$ representing the decay rate of the qubit for a particular system. Thus, unlike strong measurements, weak measurements provide the possibility of restoring the qubit to its original superposition state.

Some prior art methods propose reversing the state of the qubit $|\psi\rangle$ after a weak measurement by carrying out a second weak measurement. For example, the states $|0\rangle$ and $|1\rangle$ are first switched to transform the weak state $\alpha|0\rangle + e^{-\gamma\tau}\beta|1\rangle$ to $\alpha|1\rangle + e^{-\gamma\tau}\beta|0\rangle$. A second weak measurement (e.g., a cavity decay without registering a click in the detector) for time $\tau$ then yields $\alpha|1\rangle + \beta|0\rangle$. A subsequent interchange between $|0\rangle$ and $|1\rangle$ restores the original state of $|\psi\rangle = \alpha|0\rangle + \beta|1\rangle$. For additional details of this method, the reader is referred to Exhibit C of the '959 application.

While the prior art method including two weak measurements to restore the original state of the system is adequate, the inventors recognize that the time required for the second weak measurement is disadvantageous. One of the biggest challenges in quantum computing is decoherence. Decoherence can be viewed as the irrecoverable loss of information from a quantum computer due to the interactions with the environment. Once the quantum computer has decohered, the computations are no longer useful. Each quantum computer, depending upon the quantum system used to implement it, has an associated decoherence time. Therefore, it is important to complete quantum computations within decoherence time.

A quantum computer involves computations that typically include a large number of qubits interacting with each other. Therefore, time spent for restoring a qubit would increase the computation time of a computation in which the qubit is involved. In the case of a weak measurement, waiting for another period $\tau$ to restore the qubit can increase the total computation time of the quantum computer, which computation time if comparable to the decoherence time can make the quantum computer unreliable.

A solution to these problems is provided in this disclosure in the form of a new reversal quantum gate circuit, which does not require a second weak measurement and reduces the time required for reversal when compared to the two weak measurement method.

DETAILED DESCRIPTION

Methods and systems are disclosed for restoring a state of a qubit transformed by a weak measurement to its original state. Unlike traditional methods, in which the restoration was carried out by way of another weak measurement, the disclosed method uses an additional qubit, referred to as the ancillary qubit, and appropriate Hadamard and CNOT transformation for restoring the original state. Because the disclosed method avoids a second weak measurement, the time for restoration of the original state is considerably reduced.

Figure 1:
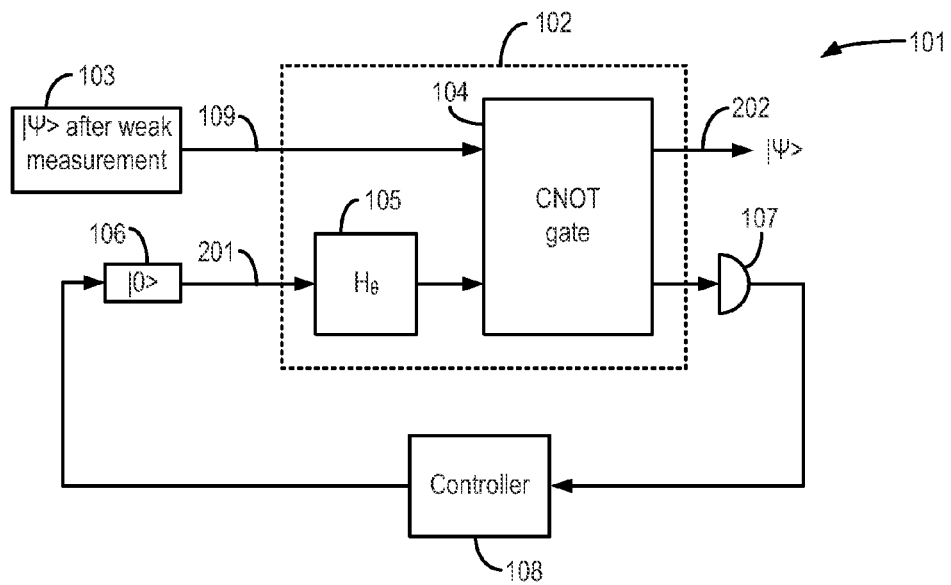
FIG. 1 illustrates a schematic of a system for reversing a state of a qubit after a weak measurement to its original state in accordance with an embodiment of the present invention.

FIG. 1 discloses a system 101 for restoring the state of a qubit $|\psi\rangle$ after a weak measurement. System 101 includes a reversing circuit 102, which receives $|\psi\rangle$ after it has undergone a weak measurement as one of its inputs. Reversing circuit 102 also receives an ancillary qubit $|0\rangle$ for interacting with the $|\psi\rangle$. The state of the ancillary bit 106 at the output of the reversing circuit 102 is measured by detector 107. The output of the detector 107 is fed to a controller 108, which, based on the detector's 107 output, determines whether the state of the qubit $|\psi\rangle$ has been restored. If the controller determines that the state has not been restored, then another ancillary bit 106 is inputted to the reversing circuit 102. Additionally, the qubit $|\psi\rangle$ at the output 202 of the reversing circuit 102, is fed back to the input 109 instead of the input 103, and a rotation angle of the Hadamard gate 105 is appropriately modified. This process is iteratively repeated until the state of the qubit $|\psi\rangle$ is determined to be restored.

As discussed above, the original state of the qubit $|\psi\rangle$ can be expressed as $|\psi\rangle = \alpha|0\rangle + \beta|1\rangle$. Because of a weak measurement, the state of the qubit $|\psi\rangle$ evolves into: $|\psi\rangle = (\alpha|0\rangle + e^{-\gamma\tau}\beta|1\rangle)/\sqrt{|\alpha|^2 + |\beta|^2 e^{-2\gamma\tau}}$. For simplicity, we denote $N_0 = \sqrt{|\alpha|^2 + |\beta|^2 e^{-2\gamma\tau}}$, and rewrite the state of qubit $|\psi\rangle$ after a weak measurement as:

$$|\psi\rangle = (\alpha|0\rangle + e^{-\gamma\tau}\beta|1\rangle)/N_0 \qquad (1)$$

The reversing circuit 102 includes a single-qubit Hadamard gate $H_\theta$ 105 connected in series with a two-qubit CNOT gate 104. Thus, the reversing circuit 102 forms a two-qubit gate. In a first iteration, one of the inputs of the reversing circuit 102 receives input 103, which is the qubit $|\psi\rangle$ after a weak measurement. For all subsequent iterations, the input 109 instead receives the output 202 of the reversing circuit 102. The other input 201 of the reversing circuit 102 receives the ancillary qubit $|0\rangle$. For the first iteration, the two-qubit input to the reversing circuit 102 can be represented as $|\psi_{12}\rangle$, and can be expressed as:

$$|\psi_{12}\rangle = (\alpha|0\rangle + e^{-\gamma\tau}\beta|1\rangle)/N_0 \otimes |0\rangle \qquad (2)$$

The step-by-step operation of the reversing circuit 102 on the qubit $|\psi_{12}\rangle$ is now described. First, the Hadamard gate $H_\theta$ 105 transforms the ancillary qubit $|0\rangle$ into $\cos\theta|0\rangle + \sin\theta|1\rangle$, where $\theta$ is a rotation angle. Because this is the first iteration of processing the qubit $|\psi_{12}\rangle$ by the reversing circuit 102, $\theta$ can be denoted as $\theta_1$. Thus, the result of the Hadamard gate $H_\theta$ 105 transforming qubit $|\psi_{12}\rangle$ in the first iteration can be expressed as:

$$|\psi_{12}\rangle = (\alpha|0\rangle + e^{-\gamma\tau}\beta|1\rangle)/N_0 \otimes (\cos\theta_1|0\rangle + \sin\theta_1|1\rangle) \qquad (3)$$

$$|\psi_{12}\rangle = (\alpha\cos\theta_1|0\rangle|0\rangle + e^{-\gamma\tau}\beta\cos\theta_1|1\rangle|0\rangle + \alpha\sin\theta_1|0\rangle|1\rangle + e^{-\gamma\tau}\beta\sin\theta_1|1\rangle|1\rangle)/N_0 \qquad (4)$$

Qubit $|\psi_{12}\rangle$, as expressed in Equation (4), is then inputted to the CNOT gate 104. As is well known, the CNOT gate is a controlled NOT gate having a control input and a target input. The CNOT gate flips the state of the target input at its output only if the control input is $|1\rangle$. For the reversing circuit 102, the qubit $|\psi\rangle$ is fed to the control input and the ancillary bit transformed by the Hadamard gate $H_\theta$105 is fed to the target input of the CNOT gate 104. In Equation (4), for each of the four terms that are summed, the first qubit state corresponds to the qubit $|\psi\rangle$ (the target input) and the second qubit state corresponds to the ancillary qubit (the control input). Thus for each of the terms in Equation (4) where the first qubit is $|1\rangle$, the second qubit will be flipped. Thus, the CNOT gate 104 transforms the qubit $|\psi_{12}\rangle$ as follows:

$$|\psi_{12}\rangle = (\alpha\cos\theta_1|0\rangle|0\rangle + e^{-\gamma\tau}\beta\cos\theta_1|1\rangle|1\rangle + \alpha\sin\theta_1|0\rangle|1\rangle + e^{-\gamma\tau}\beta\sin\theta_1|1\rangle|0\rangle)/N_0 \qquad (5)$$

Rearranging the terms in Equation (5) results in:

$$|\psi_{12}\rangle = ((\alpha\cos\theta_1|0\rangle + e^{-\gamma\tau}\beta\sin\theta_1|1\rangle) \otimes |0\rangle + (\alpha\sin\theta_1|0\rangle + e^{-\gamma\tau}\beta\cos\theta_1|1\rangle) \otimes |1\rangle)/N_0 \qquad (6)$$

Equation (6) represents the transformation of the qubit $|\psi_{12}\rangle$ by the CNOT gate 104. In each of the two summed terms of Equation (6), the right side term in the tensor product represents the state of the ancillary bit while the left hand term represents the state of the qubit $|\psi\rangle$ after CNOT transformation. Therefore, if the state of the ancillary bit were to be measured, the result of the measurement would provide the state of the qubit $|\psi\rangle$. For example, if state of the ancillary bit measured by the detector 107 were to be $|0\rangle$, then the state of the qubit $|\psi\rangle$ would be $(\alpha\cos\theta_1|0\rangle + e^{-\gamma\tau}\beta\sin\theta_1|1\rangle)$; and if the measured state were $|1\rangle$, then the state of the qubit $|\psi\rangle$ would be $(\alpha\sin\theta_1|0\rangle + e^{-\gamma\tau}\beta\cos\theta_1|1\rangle)/N_0$.

The controller 108 measures the ancillary bit using detector 107 and sets the value of $\theta_1$ to be equal to $\tan^{-1} e^{\gamma\tau}$, where $\gamma$ is the decay rate, and $\tau$ is the duration of the weak measurement. Using this value of $\theta_1$ in Equation (6), if the state of the ancillary qubit is measured to be $|0\rangle$, then the state of the qubit $|\psi\rangle$ would be $(\alpha|0\rangle + \beta|1\rangle)$. As previously stated, this is the original state of the qubit $|\psi\rangle$. Therefore, a measurement of $|0\rangle$ by the detector 107 indicates that the state of the qubit $|\psi\rangle$ at the output 202 of the reversing circuit 102 has been restored to its original state.

However, if the detector 107 measures a $|1\psi\rangle$, then the state of the qubit $|\psi\rangle$ at the output 202 of the reversing circuit 102 is given by the following Equation (7):

$$|\psi\rangle = \frac{1}{N_1}(\alpha|0\rangle + e^{-2\gamma\tau}\beta|1\rangle) \qquad (7)$$

where $N_1 = \sqrt{|\alpha|^2 + |\beta|^2 e^{-4\gamma\tau}}$. Thus, the state of the qubit $|\psi\rangle$ has not been restored to the original state. Instead, the state of the qubit $|\psi\rangle$ has been further modified to that described by Equation (7). To restore the original state, the controller 108 carries out another iteration of the above described process, but this time sets the value of $\theta$ to $\theta_2 = \tan^{-1} e^{2\gamma\tau}$, where the subscript 2 in $\theta_2$ indicates a second iteration. Additionally, the $|\psi\rangle$ at the output 202 of the reversing circuit 102 is fed back as input 109 (instead of the input 103. At the end of the second iteration, the controller 108 again measures the state of the ancillary bit. If the measured state is $|0\psi\rangle$, then the original state of the qubit $|\psi\rangle$ would be restored. On the other hand, if the measured state is $|1\rangle$, then another iteration would be carried out.

In general, the controller 108 can carry out n iterations to restore the original state of the qubit $|\psi\rangle$, with the value of $\theta_n$ in each iteration n set to:

$$\theta_n = \tan^{-1} e^{2^{n-1}\gamma\tau} \qquad (8)$$

While reversing the qubit $|\psi\rangle$ using the reversing circuit 102 may require a number of iterations, the time required for these iterations is far less than the time required for a second weak measurement. For example, in a cavity QED system, the time required for a second weak measurement on a qubit can be in the order of a few milliseconds, whereas the time for a single iteration of the reversing circuit 102 can be in the order of tens of microseconds—an approximately two orders of magnitude reduction. Therefore, even if a few iterations of the reversing circuit 102 may be required for reversing the qubit, the total time for reversal is far less than that required for reversing using a second weak measurement.

It is understood that the system 101 of FIG. 1, and in particular the reversing circuit 102, can be implemented on any physical system that can support a quantum computer. Examples of such physical systems are Josephson junctions, optical lattices, quantum dots, nuclear magnetic resonance, cavity quantum electrodynamics (QED), etc. In particular, implementation of the reversal circuit in a cavity QED system is described in detail in Exhibit A (Section III) and Exhibit D of the '959 application. Therefore, some implementation details are not repeated in the discussion below for sake of brevity and clarity. The following discusses a preferred embodiment of the system 101 implemented using a cavity QED system.

Figure 2:
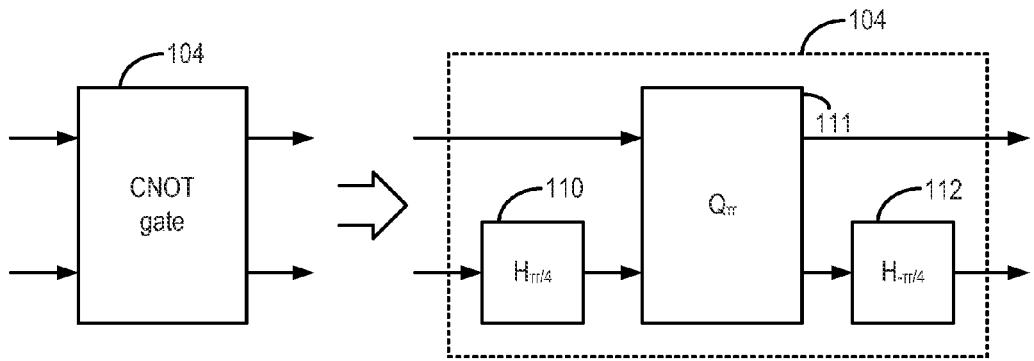
FIG. 2 illustrates building a CNOT gate with two Hadamard gates and a phase gate in accordance with an embodiment of the present invention.

A person skilled in the art will appreciate that high level quantum gates such as CNOT gates can be represented as a combination of universal quantum gates. As such, it is well known that the CNOT gate of reversal circuit 102 can be built using two Hadamard gates and phase gate. For example, FIG. 2 shows a schematic of the CNOT gate 104 of FIG. 1 being represented by a first Hadamard gate $H_{\pi/4}$ 110, phase gate $Q_\pi$ 111, and a second Hadamard gate $H_{-\pi/4}$ 112, all connected in series. Such decomposition of the CNOT gate is beneficial when the physical system is a cavity QED system because implementation of Hadamard gates and phase gates in cavity QED systems are well understood in the art.

Figure 3:
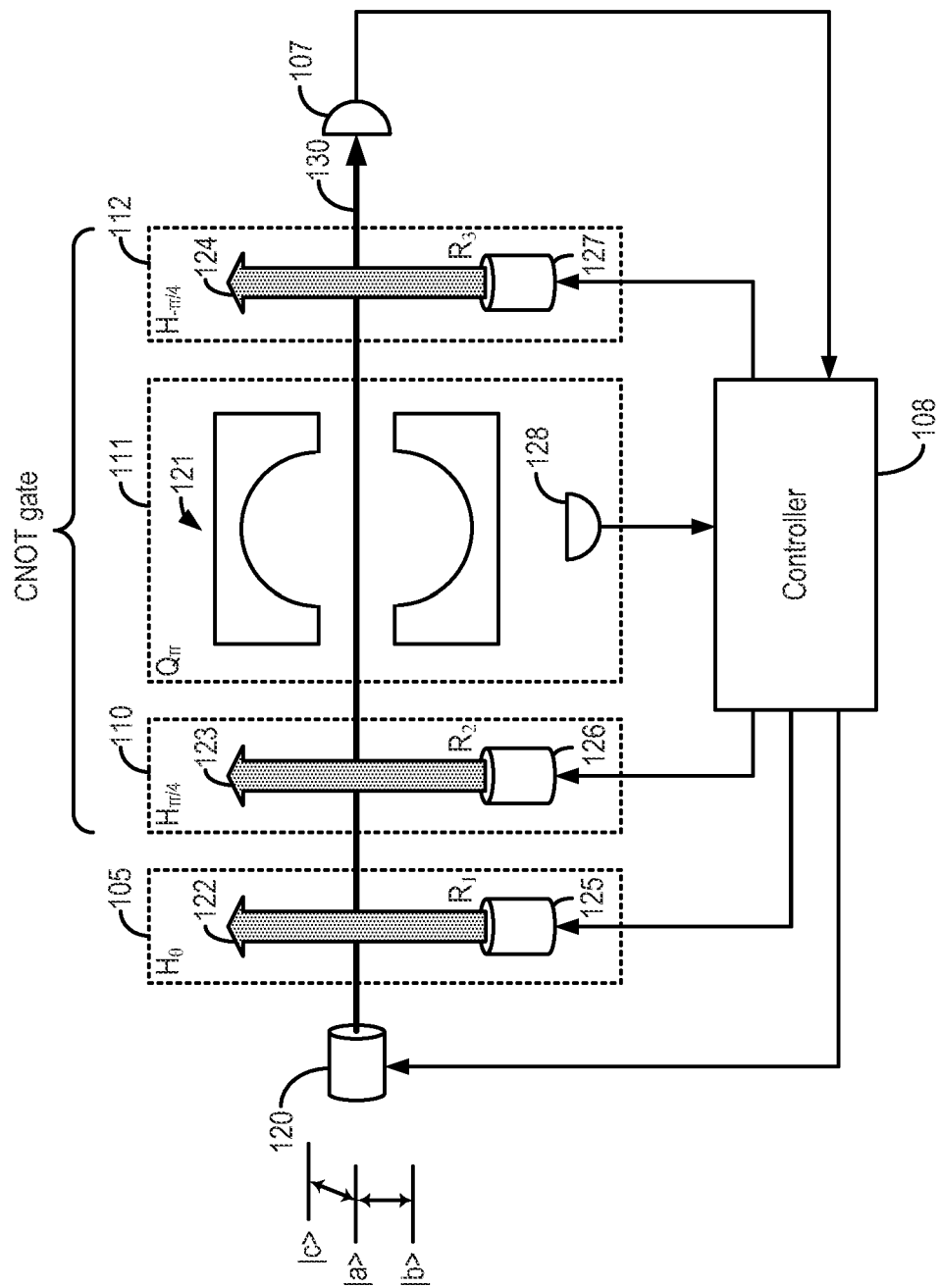
FIG. 3 shows a schematic of a cavity QED system implementing the schematic of FIG. 1 in accordance with an embodiment of the present invention.

Using the representation of the CNOT gate described in FIG. 2, FIG. 3 shows an exemplary implementation of system 101 of FIG. 1 using a cavity QED system. The Hadamard gates $H_\theta$ 105, $H_{\pi/4}$ 110, and $H_{-\pi/4}$ 112 are implemented by microwave fields R1 122, R2 123, and R3 124 respectively, which are also known as Ramsey fields in the art. The phase gate $Q_\pi$ 111 is implemented using a cavity 121. The qubit $|\psi\rangle$ is represented by a photon within the cavity 121 of phase gate $Q_\pi$ 111, and the ancillary qubit is represented by an atom emitted from an atom source 120. Controller 108 can be a microcontroller, a microprocessor, an application specific integrated circuit, an FPGA, etc. Controller 108 is connected to the microwave sources 125, 126, and 127; the cavity 121 and cavity detector 128; and atom source 120.

The photon within the cavity 121 has undergone a weak measurement, which is reversed using the atom. It is desirable that the type of atom selected have a decoherence time that is significantly larger than both its interaction time with the cavity 121 and the time associated with the loss of photon from the cavity 121. This ensures that the atom will maintain coherence throughout time it takes for the reversal circuit 102 to carry out its computation. While any atom that satisfies this condition can be used, Rydberg atoms are a popular choice. The atom source 120 can generate a Rydberg atom with a predetermined velocity. The Rydberg atom can have three energy levels $|a\rangle$, $|b\rangle$, and $|c\rangle$ in cascade configuration. The lower two levels, $|b\rangle$ and $|a\rangle$, represent states $|0\rangle$ and $|1\rangle$, respectively. State $|c\rangle$ is selected to allow detuning with the cavity 121. Source 120 prepares the atom in the $|b\rangle$ state (i.e., $|0\rangle$ state) before it passes through the Ramsey fields R1 122 and R2 123, the cavity 121, and Ramsey field R3 124. The passage of the atom from the source 120 to the detector 107 is denoted by the arrow 130. The predetermined velocity (e.g., 300 m/s) of the Rydberg atom determines the appropriate duration of interaction of the Rydberg atom in each of the Ramsey fields R1 122, R2 123, and R3 124, and the cavity 121.

Ramsey field R1 implements the Hadamard gate $H_\theta$ 105. When the Rydberg atom interacts with the Ramsey field R1 122, the two qubit system formed by the Rydberg atom and the photon in the cavity 121 will be transformed to a state that was previously described by Equations (3) and (4). Note that Equation (8) described the value of $\theta_n$ to be set to $\theta_n = \tan^{-1} e^{2^{n-1}\gamma\tau}$ for each iteration. For the Ramsey field R1 122 $\theta_n$ is a function of the Rabi frequency $\Omega$ and the interaction time t, where the Rabi frequency $\Omega$ is the frequency of the source 125 and the interaction time t is the duration of time for which the Rydberg atom is energized by the Ramsey field R1 122. In one example, where the intensity of the Ramsey field R1 122 stays constant for the duration of the interaction time, $\theta_n$ is the product of the Rabi frequency $\Omega$ and the interaction time t. The controller 108 can control the source 125 to generate a Ramsey field R1 122 such that $\Omega_n t_n = \tan^{-1} e^{2^{n-1}\gamma\tau}$, where $\Omega_n$ and $t_n$ are the Rabi frequency and the interaction time for the nth iteration.

After passing through the Ramsey field R1 122, the Rydberg atom passes through the CNOT gate 104 formed by the Ramsey field R2 123, the cavity 121, and the Ramsey field R3 124. As previously mentioned, the Ramsey fields R2 123 and R3 124 implement the Hadamard gates $H_{\pi/4}$ 110, and $H_{-\pi/4}$ 112. Similar to the Hadamard gate $H_\theta$ 105, the product of Rabi frequency $\Omega_{123}$ and the interaction time $t_{123}$ for the Ramsey field 123 can be selected to be equal to $\pi/4$. For Ramsey field R3 124, the product of Rabi frequency $\Omega_{124}$ and the interaction time $t_{124}$ can also be selected to be equal to $\pi/4$, except that the phase is shifted by $\pi$.

Implementation of the phase gate $Q_\pi$ 111 and cavity 121 is presented with great detail in Exhibit D of the '959 application, and therefore not repeated here.

Once the Rydberg atom passes through the Ramsey field R3 124, its state is detected by the detector 107. For example, detector 107 can be a Ramsey separated oscillatory field interferometer. Detector 107 detects whether the state of the Rydberg atom is in the $|b\rangle$ or $|a\rangle$ state, and outputs the outcome to the controller 108. If the detected state is $|b\rangle$, then this indicates that the state of the qubit $|\psi b\rangle$ in the cavity 121 has been restored to the original state of $|\psi\rangle = \alpha|0\rangle + \beta|1\rangle$. As a result the controller 108 stops the process. If however, the detected state is $|a\rangle$, this indicates that state of the qubit $|\psi\rangle$ has further evolved into a state described by Equation (7) above. Thus, the controller 108 begins another iteration of reversing the qubit $|\psi\rangle$ by instructing source 120 to generate another Rydberg atom. These iterations are repeated until the detector 107 detects the Rydberg atom in state $|b\rangle$.

At the beginning of each iteration, the controller 108 appropriately adjusts source 125 of Ramsey field R1 122 such that the product of Rabi frequency $\Omega$ and the interaction time t satisfies the equation $\Omega_n t_n = \tan^{-1} e^{2^{n-1}\gamma\tau}$.

Note that the controller 108 is also coupled to the detector 128, which detects the leakage of the photon from cavity 121. The leakage of the photon indicates that the system is no longer operational. In response, the controller can generate an aural/visual signal to annunciate this condition. To restart the system, the cavity would have to be re-prepared with a single photon representing the qubit $|\psi\rangle$.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. Thus, the present invention is intended to cover alternatives, modifications, and equivalents that may fall within the spirit and scope of the present invention as defined by the claims.

What is claimed is:

1. A reversal quantum circuit for restoring a state of a qubit after a weak measurement for a duration of time $\tau$, the qubit having an associated decay rate $\gamma$, to its state before the weak measurement, comprising:
    an ancillary qubit prepared in state $|0\rangle$;
    a Hadamard gate comprising an input and an output, wherein the input of the Hadamard gate receives the ancillary qubit; and
    a CNOT gate comprising a control input receiving the qubit after the weak measurement, a target input receiving the output of the Hadamard gate, a control output producing a transformed qubit, and a target output producing a transformed ancillary qubit,
    wherein a rotation angle associated with the Hadamard gate is a function of the decay rate $\gamma$ and the duration $\tau$.

2. The reversal quantum circuit of claim 1, further comprising:
    a detector for measuring a state of the transformed ancillary qubit at the target output of the CNOT gate,
    wherein the input of the Hadamard gate iteratively receives the ancillary qubit prepared in state $|0\rangle$ and the control input of the CNOT gate iteratively receives the control output instead of the qubit after the weak measurement each time the detector measures state $|1\rangle$, and
    wherein the rotation angle associated with the Hadamard gate is additionally a function of an iteration number n, the iteration number n being equal to a number of times the detector detects state $|1\rangle$.

3. The reversal quantum circuit of claim 1, wherein the rotation angle of the Hadamard gate is equal to $\tan^{-1} e^{2^{n-1}\gamma\tau}$.

4. The reversal quantum circuit of claim 1, wherein the circuit is implemented using a cavity quantum electrodynamics (QED) system.

5. A method for restoring a state of a qubit after a weak measurement of duration $\tau$, the qubit having an associated decay rate $\gamma$, comprising:
    (a) preparing an ancillary qubit in state $|0\rangle$;
    (b) applying Hadamard transformation on the ancillary qubit, the Hadamard transformation having a rotation angle associated with it;
    (c) applying a CNOT transformation on the qubit after a weak measurement and the Hadamard transformed ancillary qubit, wherein the qubit after a weak measurement is a control qubit and the Hadamard transformed ancillary qubit is a target qubit, to produce a CNOT transformed qubit and a CNOT transformed ancillary qubit;
    wherein the rotation angle of the Hadamard transformation is a function of the decay rate $\gamma$ and the duration $\tau$.

6. The method of claim 5, further comprising:
    (d) measuring a state of the CNOT transformed ancillary qubit;
    (e) incrementing by one an iteration number n having an initial value equal to 1;
    repeating steps (a)-(e) each time measuring results in a state $|1\rangle$,
    wherein for each iteration the rotation angle of the Hadamard transformation is also a function of the iteration number n, and
    wherein for each iteration, the CNOT transformed qubit serves as a control qubit instead of the qubit after a weak measurement.

7. The method of claim 6, wherein the rotation angle of the Hadamard transformation is equal to $\tan^{-1} e^{2^{n-1}\gamma\tau}$.

* * * * *

UNITED STATES PATENT AND TRADEMARK OFFICE
CERTIFICATE OF CORRECTION

PATENT NO. : 8,350,587 B2
APPLICATION NO. : 13/278768
DATED : January 8, 2013
INVENTOR(S) : Zubairy et al.

It is certified that error appears in the above-identified patent and that said Letters Patent is hereby corrected as shown below:

Title Page item (73), the Assignee should be listed as:
Texas A&M University System, College Station, TX (US)
--King Abdulaziz City for Science and Technology, Riyadh (SA)--

Signed and Sealed this
Twenty-third Day of July, 2013

Teresa Stanek Rea
*Acting Director of the United States Patent and Trademark Office*